US005227591A

United States Patent [19]
Tarkkonen

[11] Patent Number: 5,227,591
[45] Date of Patent: Jul. 13, 1993

[54] LOUDSPEAKER ARRANGEMENT

[76] Inventor: Timo Tarkkonen, PPA 2 Loukunvaara, SF-82500 Kitee, Finland

[21] Appl. No.: 678,982
[22] PCT Filed: Nov. 7, 1989
[86] PCT No.: PCT/FI89/00205
§ 371 Date: Apr. 29, 1991
§ 102(e) Date: Apr. 29, 1991
[87] PCT Pub. No.: WO90/05434
PCT Pub. Date: May 17, 1990

[30] Foreign Application Priority Data
Nov. 8, 1988 [FI] Finland ................................ 885131

[51] Int. Cl.[5] ............................................ H05K 5/00
[52] U.S. Cl. .................................... 181/145; 181/153; 181/154; 181/155
[58] Field of Search ............... 181/144, 145, 146, 151, 181/152, 153, 154, 155, 199; 381/88, 90, 96, 155, 186

[56] References Cited

U.S. PATENT DOCUMENTS

| | | | |
|---|---|---|---|
| 3,914,549 | 10/1975 | Bose | 381/103 |
| 3,931,867 | 1/1976 | Janszen | 181/155 |
| 4,673,057 | 6/1987 | Glassco | 181/144 |

FOREIGN PATENT DOCUMENTS

| | | |
|---|---|---|
| 1812596 | 10/1969 | Fed. Rep. of Germany . |
| 3142462 | 5/1982 | Fed. Rep. of Germany . |
| 1269550 | 4/1972 | United Kingdom . |
| 2016863 | 9/1979 | United Kingdom . |

*Primary Examiner*—Michael L. Gellner
*Assistant Examiner*—K. Dang
*Attorney, Agent, or Firm*—Merchant & Gould, Smith, Edell, Welter & Schmidt

[57] ABSTRACT

The invention relates to a loudspeaker arrangement for creating a three-dimensional stereo sound effect. The loudspeaker arrangement is to be located at a suitable distance from sound-reflecting surfaces. The loudspeaker elements (**12*a*, 13*a*, 14*a*; 12*b*, 13*b*, 14*b*) of the left-hand channel (2) and the right-hand channel (3) in the loudspeaker arrangement are located within one and the same loudspeaker unit (1), where they are separated from each other by means of a zone (4) which is at least of the same size as the interval (a) between human ears. The loudspeaker elements are arranged to radiate towards different sides (A, B) of the said zone (4), in a similar fashion, within 180° circle sectors, in which case the sounds reflected from the surfaces, together with the sounds coming directly from the loudspeaker unit, create a depthwise expanded, three-dimensional stereo sound effect, mainly within the sector (10**) expanding away from the loudspeaker unit.

6 Claims, 2 Drawing Sheets

LOUDSPEAKER ARRANGEMENT

Figure 1:
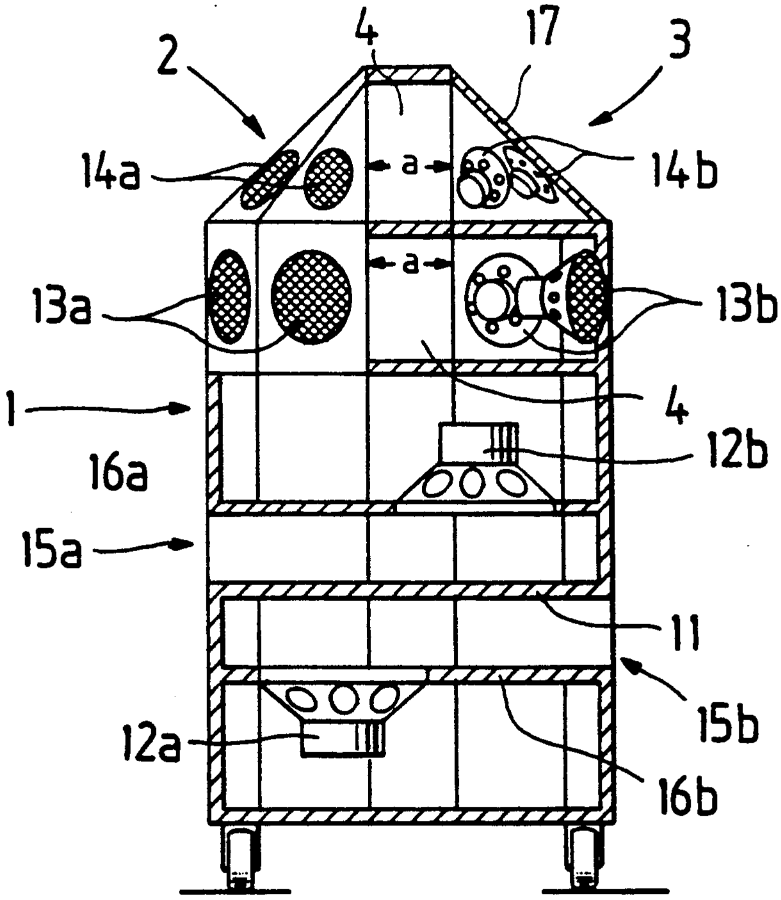

The invention relates to a loudspeaker arrangement defined in the introductory section of the appended patent claim 1.

In principle a stereophonic sound effect is nowadays created so that a musical performance or the like is recorded with two microphones that are advantageously located at a distance from each other, the said distance corresponding to the interval between human ears. The voltage signals from the microphones are amplified in respective amplifiers, and recorded, generally each sound channel separately, to a suitable means such as a record or tape. Correspondingly, the obtained record is played by amplifying the sound signal recorded in each channel in respective amplifiers, and by reproducing the sound via loudspeakers placed at a suitable distance.

The problem with the current system is that a stereo effect is generally formed only if the loudspeakers of the separate channels together with the listener form an isosceles triangle, so that the listener is located at the point of the triangle. Thus the creation of a depthwise expanded stereo effect within a large space is difficult.

Another problem is that the current arrangements require at least two loudspeaker units.

In the prior art there is known, from the FI patent publication 35,014, an arrangement where two normal stereo channel signals are electrically transformed into three different outlet signals, which are amplified and fed out via three loudspeaker units. To a certain degree this type of arrangement creates a stereophonic impression of depthwise extension within the given space.

The problem with the aforementioned arrangement is that it requires three loudspeaker units and a special amplifier for producing three outlet signals out of two normal stereo channel signals.

The biggest drawback with the present-day stereo loudspeaker arrangements is that they are difficult to place within the given space so that the listeners on different sides of the space could get a clear stereophonic impression of the record being played. On the other hand, if the arrangement according to the above described Finnish patent publication is applied, special equipment is required.

A further drawback with current stereo loudspeaker arrangements is that the created stereophonic sound effect hardly gives an impression of a depthwise expanded sound. The sound field seems to come flat out of the wall. In a system of two loudspeakers, it is true, it is to some degree possible to create a depthwise extension of the sound field, particularly within the medium level of the loudspeakers, but the impression of the space of the performance remains, however, inadequate, and greatly dependent on the imagination of the listener.

The object of the present invention is to eliminate the above mentioned drawbacks. The loudspeaker arrangement of the invention means a substantial improvement in the creation of a threedimensional stereo sound effect within a given space.

The loudspeaker arrangement of the invention characterized by the features enlisted in the patent claim 1.

The loudspeaker arrangement of the invention for creating a three-dimensional stereo sound effect is to be placed at a suitable distance from sound-reflecting surfaces. According to the invention, the loudspeaker elements of the left and right channels in the loudspeaker arrangement are located within one and the same loudspeaker unit, where they are separated from each other by means of a zone corresponding at least to the size of the interval between human ears, and where they are arranged to radiate towards different sides of the said zone, in a similar fashion, within 180° circle sectors, so that the sounds reflected from the surfaces, together with the sounds coming directly from the loudspeaker unit, create a depthwise expanded, threedimensional stereo sound effect, mainly within the sector expanding away from the loudspeaker unit.

In a preferred embodiment of the invention, the bass elements of the left and right channels are placed vertically with the cones towards opposite directions, so that in between them there is placed a sound reflection plate.

The most important advantage of the invention is that by employing only one loudspeaker unit, there is created a stereophonic, depthwise expanded impression of the original space of performance. Thus the impression that the listener receives of a musical performance or the like comes close to the real impression experienced by the listeners present at the original performance.

Another advantage of the present invention is that the loudspeaker arrangement renders a three-dimensional stereo effect within a radiation sector of advantageously 45–50 degrees. Thus the position of the listener with respect to the loudspeaker obtains arrangement is fairly free. Hence the listener obtains a depthwise expanded, stereophonic sound impression in the biggest part of the given space.

Yet another advantage of the invention is that the loudspeaker arrangement is compatible with all regular stereo systems.

Figure 2:
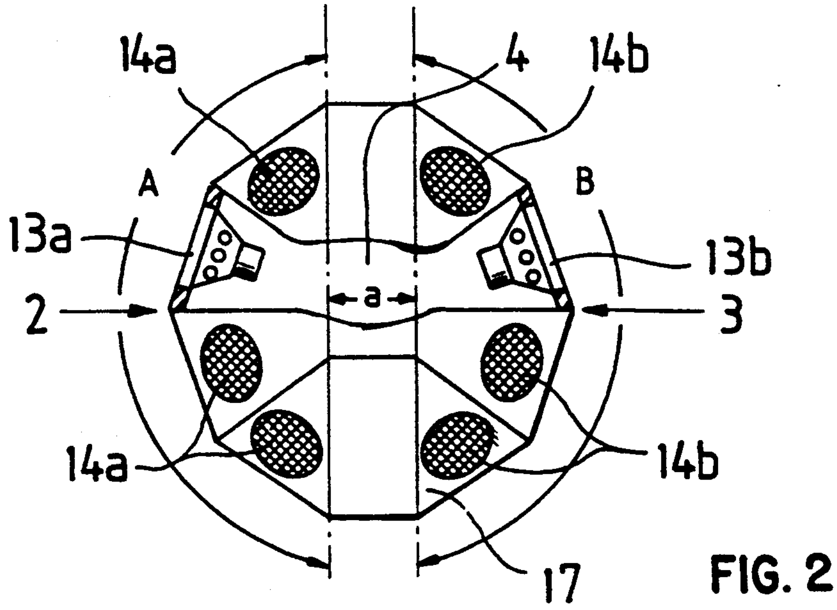
Figure 3:
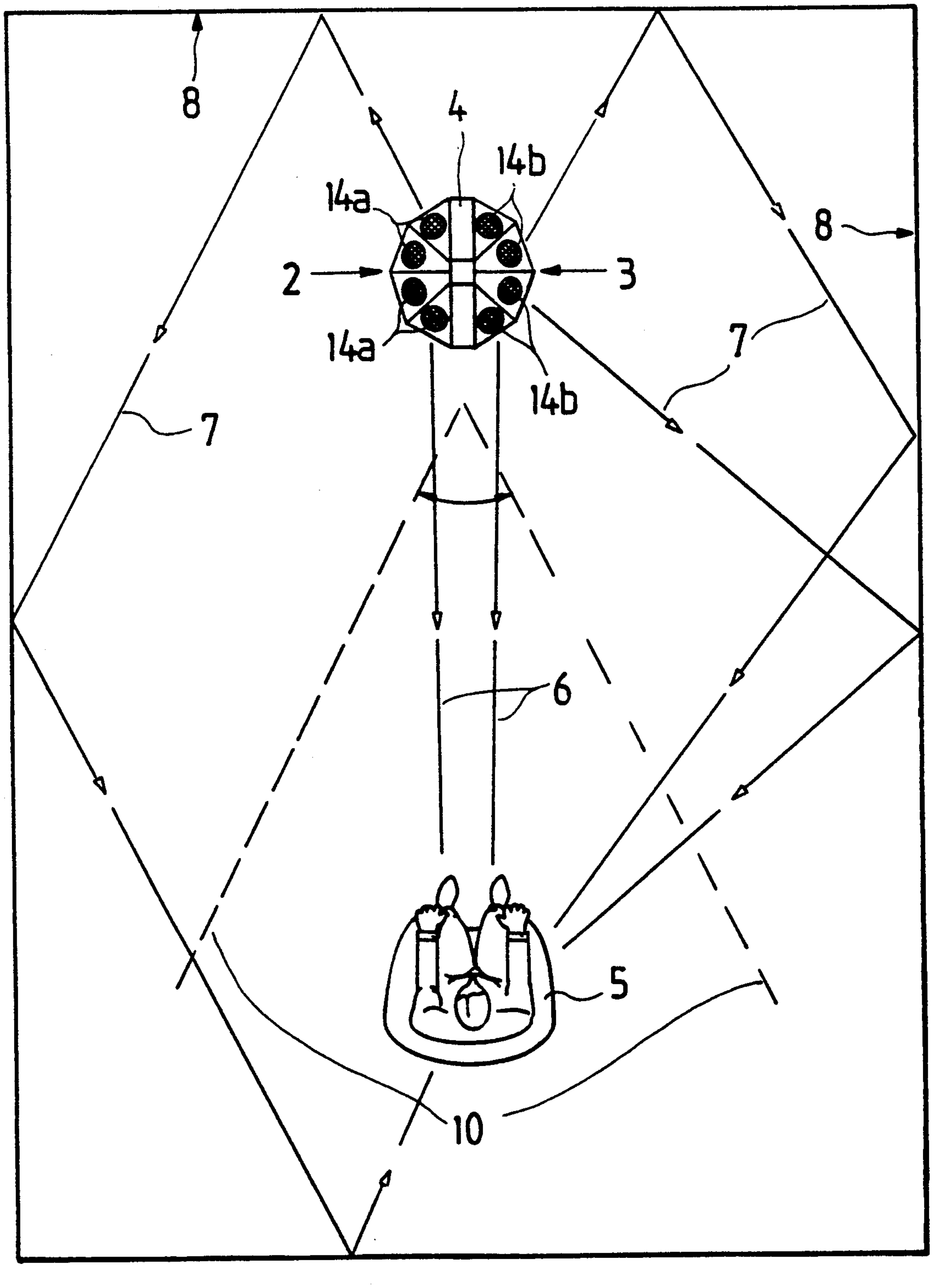

In the following the invention is explained in more detail with reference to the appended drawings, where FIG. 1 is an illustration of a loudspeaker arrangement of the invention, seen from the side in partial cross-section;

FIG. 2 in an illustration of the loudspeaker arrangement of FIG. 1, seen from the top in partial cross-section; and FIG. 3 is an illustration of the operation of the loudspeaker arrangement of the invention within a given space with sound-reflecting walls.

FIGS. 1 and 2 represent a schematical illustration of a loudspeaker arrangement of the invention. The loudspeaker elements **12*a*, 13*a*, 14*a* and respectively 12*b*, 13*b* and 14*b*, of the left 2 and right 3 channels are placed within one and the same loudspeaker unit 1. The loudspeaker elements of the left 2 and right 3 channels are separated from each other by means of a vertical zone 4. In this case the zone 4 is a sound-penetrating space, which is arranged particularly in between the medium sound elements 13*a*, 13*b* and the treble sound elements 14*a*, 14*b*. The width a of the zone 4** is within the range of 15 . . . 25 cm, which corresponds to the interval of human ears from each other.

The loudspeaker elements of both channels 2, 3, particularly the medium and treble elements **13*a*, 14*a*; 13*b*, 14*b*, are located in the form of a semicircle within the loudspeaker unit 1**, so that they radiate towards their respective 180° circle sectors A, B.

The bass elements **12*a*, 12*b* are located in the bottom part of the loudspeaker unit 1. They are placed vertically, with the loudspeaker cones towards opposite directions, and installed in the support plates 16*a*, 16*b*. In between the bass elements 12*a*, 12*b* there is placed the sound reflection plate 11. Thus the low sounds are directed from the bass elements 12, through the spaces in between the sound reflection plate 11 and the support plates 16***a*, 16*b*, via the openings 15*a*, 15*b*, each to their respective sectors A, B to different sides of the zone 4.

In the loudspeaker arrangement of FIGS. 1 and 2, at least part of the treble elements 14*a*, 14*b* are located in the conical top part 17 of the loudspeaker unit 1.

In the loudspeaker arrangement there can also be utilized double-cone loudspeakers, which have a large sound frequency range. They can be placed in their own loudspeaker unit, for instance in the same fashion as the medium sound elements 13*a*, 13*b* in the loudspeaker unit of FIG. 2, and a vertical zone 4 is arranged in between the loudspeaker elements of the left and right channels. Thus separate treble and bass loudspeaker elements become unnecessary.

In FIG. 3, the loudspeaker arrangement of the invention is located within the given space. The loudspeaker unit 1 is at a suitable distance from the sound-reflecting surfaces 8. Thus the sound wave fields produced by the sound elements 12*a*, 13*a*, 14*a*; 12*b*, 13*b*, 14*b* of the two sound channels 2, 3 arrive both directly, via the paths 6, and as reflected from the surfaces 8 of the space or from furniture, via the path 7, to the ears of the listener 5. The sound waves of the separate channels arrive to the ears of the listener at somewhat different times and in slightly different phases when compared to each other. This creates a sound effect which gives the listener 5 the impression that he is present at the original performance.

Owing to the influence of the zone 4, the loudspeaker elements 13*a*, 13*b*; 14*a*, 14*b* of the separate channels create an acoustic feedback to each other. Because the width of the zone 4 is chosen to be at least the length of the interval between human ears, i.e. the same distance as between the microphones during the recording, there is created, together with the sounds reflected from the surfaces and the sounds coming directly from the loudspeaker unit 1, a depthwise expanded, three-dimensional stereo sound effect, mainly within the sector, parallel to the zone 4, expanding away from the loudspeaker unit, which sector is advantageously about 50°. The dotted lines in FIG. 1 designate the radiation sector 10.

In the above described preferred embodiments of the loudspeaker arrangement of the invention, the feedback between the loudspeaker elements of the separate channels of the loudspeaker arrangement is acoustic. The feedback can alternatively be carried out at least partly electrically, by feeding a small part of the sound signals from the channels crosswise to opposite channels. Thus the zone 4 can be a suitable wide, sound-proof space a in between the loudspeaker elements of the separate channels.

I claim:

1. A loudspeaker arrangement for creating a three dimensional stereo sound effect, which loudspeaker arrangement is to be located at a suitable distance from sound-reflecting surfaces, in which loudspeaker arrangement the loudspeaker elements (12*a*, 13*a*, 14*a*; 12*b*, 13*b*, 14*b*) of the left and right channels (2, 3) are located within one loudspeaker unit (1), characterized in that the loudspeaker elements (12*a*, 13*a*, 14*a*; 12*b*, 13*b*, 14*b*) are separated from each other by means of a vertical zone (4) which is of a same size as interval (a) between human ears, and where the loudspeaker elements are located in the form of a semi-circle within the loudspeaker unit (1) so that they radiate towards different sides (A, B) of the said zone (4), in a similar fashion, within 180° circle sectors, in which case sounds reflected from the surfaces, together with sounds coming directly from the loudspeaker unit, create a depthwise expanded, three-dimensional stereo sound effect, mainly within a sector expanding away from the loudspeaker unit.

2. A loudspeaker arrangement according to claim 1, characterized in that the zone (4) is a sound-penetrating space.

3. A loudspeaker arrangement according to claim 2, characterized in that the width of the zone (4) is within a range of 15–25 cm.

4. A loudspeaker arrangement according to claim 2 characterized in that the zone (4) is arranged in between medium loudspeaker elements (13*a*, 13*b*) and treble loudspeaker elements (14*a*, 14*b*).

5. A loudspeaker arrangement according to claim 4, characterized in that at least part of treble loudspeaker elements (14*a*, 14*b*) are located in a conical top part (17) of the loudspeaker unit (1).

6. A loudspeaker arrangement according to claim 1, characterized in that bass loudspeaker elements (12*a*, 12*b*) of the left and right channels (2,3) are placed vertically with cones towards opposite directions, so that a sound reflection plate (11) is placed in between them.

* * * * *